(12) United States Patent
Chen et al.

(10) Patent No.: US 8,333,912 B2
(45) Date of Patent: Dec. 18, 2012

(54) THERMOELECTRIC COMPOSITE MATERIAL AND METHOD OF PRODUCING THE SAME

(75) Inventors: Lidong Chen, Shanghai (CN); Monika Backhaus-Ricoult, Horseheads, NY (US); Lin He, Horseheads, NY (US); Zhen Xiong, Shanghai (CN); Xihong Chen, Shanghai (CN); Xiangyang Huang, Shanghai (CN)

(73) Assignees: Corning Incorporated, Corning, NY (US); Shanghai Institute of Ceramics, Shanghai (CN)

( * ) Notice: Subject to any disclaimer, the term of this patent is extended or adjusted under 35 U.S.C. 154(b) by 18 days.

(21) Appl. No.: 12/833,401

(22) Filed: Jul. 9, 2010

(65) Prior Publication Data

US 2011/0006249 A1 Jan. 13, 2011

(30) Foreign Application Priority Data

Jul. 10, 2009 (CN) .......................... 2009 1 0054622

(51) Int. Cl.
*H01B 1/02* (2006.01)
*H01B 1/06* (2006.01)
*H01B 1/24* (2006.01)

(52) U.S. Cl. ............ 252/518.1; 252/500; 252/506; 136/250; 136/236.1; 136/200; 136/201; 164/122; 164/53

(58) Field of Classification Search .............. 252/73, 252/500, 506, 518.1; 136/250, 236.1, 200, 136/201; 164/122, 53
See application file for complete search history.

(56) References Cited

U.S. PATENT DOCUMENTS

| | | | | |
|---|---|---|---|---|
| 5,236,622 A * | 8/1993 | Yoneda et al. | ............... | 516/33 |
| 5,411,599 A * | 5/1995 | Horn et al. | ............... | 136/203 |
| 5,929,351 A | 7/1999 | Kusakabe et al. | ............... | 75/228 |
| 5,965,841 A | 10/1999 | Imanishi et al. | ............... | 136/240 |
| 6,207,886 B1 | 3/2001 | Kusakabe et al. | ............... | 136/201 |
| 6,225,548 B1 | 5/2001 | Sakakibara et al. | ............... | 136/201 |
| 6,858,154 B2 | 2/2005 | Suzuki et al. | ............... | 252/62.3 |
| 7,309,830 B2 * | 12/2007 | Zhang et al. | ............... | 136/236.1 |
| 7,465,871 B2 | 12/2008 | Chen et al. | ............... | 136/236.1 |
| 8,097,802 B2 * | 1/2012 | Yang et al. | ............... | 136/236.1 |
| 2005/0194573 A1 * | 9/2005 | Yamashita | ............... | 252/500 |
| 2005/0284512 A1 | 12/2005 | Heremans et al. | ............... | 136/236.1 |
| 2006/0249704 A1 | 11/2006 | Ren et al. | ............... | 252/62.3 |
| 2008/0173344 A1 | 7/2008 | Zhang et al. | ............... | 136/238 |
| 2009/0004086 A1 * | 1/2009 | Kuhling et al. | ............... | 423/276 |
| 2012/0025154 A1 * | 2/2012 | Rowe | ............... | 252/519.4 |
| 2012/0199797 A1 * | 8/2012 | Rowe | ............... | 252/519.4 |

FOREIGN PATENT DOCUMENTS

CN 1201769 A 12/1998
(Continued)

OTHER PUBLICATIONS

He et al. "Nano ZrO2/CoSb3 composites with improved thermoelectric figure of merit", Nanotechnology, 18, 2007, 235602. see "Nanotech_He_2007.pdf".*

(Continued)

*Primary Examiner* — Peter F Godenschwager
*Assistant Examiner* — Jane L Stanley
(74) *Attorney, Agent, or Firm* — Michael W. Russell

(57) ABSTRACT

A process for making a composite material and the composite materials having thermoelectric properties.

18 Claims, 6 Drawing Sheets

FOREIGN PATENT DOCUMENTS

| | | | |
|---|---|---|---|
| CN | 1614054 A | | 5/2005 |
| CN | 1803938 A | | 7/2006 |
| CN | 1888105 A | | 1/2007 |
| CN | 1958820 A | | 5/2007 |
| JP | 2011204835 A | * | 10/2011 |
| WO | WO2006/062582 | | 6/2006 |

OTHER PUBLICATIONS

Cahill, et al, "Lower limit to the thermal conductivity of disordered crystals," Physical Review B, vol. 46, No. 10 Sep. 1, 1992-II.

Sales et al., Filled skutterudite antimonides: A new class of thermoelectric materials, *Science*, 272, p. 1325-1328, May 31, 1996.

Tritt, et al., "Low-temperature transport properties of the filled and unfilled IrSb$_3$ skutterudit system," *J. Appl. Phys.* 79, (11) p. 8412-8418, Jun. 1, 1996.

Chen et al., "Anomalous barium filling fraction and n-type thermoelectric performance o Ba$_y$Co$_4$Sb$_{12}$," *J. Appl. Phys.* vol. 90, No. 4, p. 1864-1868, Aug. 15, 2001.

Chen et al., "Recent developments in thermoelectric materials," *Int. Mater. Rev.* 48, No. 1 p. 45-66, 2003.

Morelli, et al. "Cerium filling and doping of cobalt triantimonide," *Phys. Rev. B* vol. 56, No. 12, p. 7376-7383, Sep. 15, 1997-II.

Watcharapasorn, et al., "Preparation and thermoelectric properties of some phosphid skutterudite compounds," *J. Appl. Phys.* vol. 86, No. 11, p. 6213-6217, Dec. 1, 1999.

Nolas, et al., "High figure of merit in partially filled ytterbium skutterudite materials" *Appl. Phys. Lett.* vol. 77, No. 12, p. 1855-1857, Sep. 18, 2000.

Xie, et al., "The preparation and thermoelectric properties of Ti$_{0.5}$Zr$_{0.25}$Hf$_{0.25}$Co$_{1-x}$Ni$_x$Sb half Heusler compounds," *Journal of Applied Physics*, 103, p. 043711, 2008.

Sakurada, et al., "Effect of Ti substitution on the thermoelectric properties of (Zr,Hf)NiS: half-Heusler compounds,"*Applied Physics Letters*, 86, p. 082105, 2005.

Yang, et al., "Evaluation of Half-Heusler Compounds as Thermoelectric Materials Based on the Calculated Electrical Transport Properties," *Advanced Functional Materials*, 18, p. 2880-2888, 2008.

Chen, et al., "The high temperature thermoelectric performances o Zr$_{0.5}$Hf$_{0.5}$Ni$_{0.8}$Pd$_{0.2}$Sn$_{0.99}$Sb$_{0.01}$ alloy with nanophase inclusions," *Journal of Applied Physics* 99, p. 064305, 2006.

Kim, et al., "High thermoelectric performance of type-III clathrate compounds of the Ba-Ge Ga system," *Acta Materialia*, 54, p. 2057-2062, Feb. 28, 2006.

Mudryk, et al., "Thermoelectricity of clathrate ISi and Ge phases," *Journal of Physics Condensed Matter*, 14, p. 7991-8004, 2002.

Huo, et al., "Structural, transport, and thermal properties of the single-crystalline type-VII clathrate Ba$_8$Ga$_{16}$Sn$_{30}$," *Physical Review B*, 71, p. 075113, 2005.

Faleev et al., "Theory of enhancement of thermoelectric properties of materials wit nanoinclusions," *Phys. Rev. B*, 77, p. 214-304, Jun. 12, 2008.

He et al., Nano ZrO$_2$/CoSb$_3$ composites with improved thermoelectric figure of merit, *Nanotechnology*, 18, p. 235602, 2007.

Shi et al., Enhanced thermoelectric figure of merit of CoSb$_3$ via large-defect scattering, *Appl. Phys. Lett.*, vol. 84, No. 13, p. 2301-2303, Mar. 29, 2004.

Li, et al., "Preparation and thermoelectric properties of high-performance Sb additional Yb$_{0.2}$Co$_4$Sb$_{12+y}$ bulk materials with nanostructure," *Applied Physics Letters*, 92, p. 202114, May 2, 2008.

Heremans, et al., "Thermopower enhancement in PbTe with Pb precipitates," *Journal of Applied Physics*, 98, p. 063703, Sep. 16, 2005.

Zhao, et al., Synthesis of Yb$_y$Co$_4$Sb$_{12}$/Yb$_2$O$_3$ composites and their thermoelectric properties, *Appl. Phys. Lett.*, 89, p. 092121, Sep. 1, 2006.

Xiong, et al., "Effects of nano-TiO$_2$ dispersion on the thermoelectric properties of filled-skutterudite Ba$_{0.22}$Co$_4$Sb$_{12}$", Solid State Sciences 11, (2009), pp. 1612-1616.

Nan, et al, "Synthesis and thermoelectric properties of (Na$_x$Ca$_{1-x}$)$_3$Co$_4$O$_9$ ceramics", Journal of the European Ceramic Society 23, (2003), pp. 859-863.

Cheng, et al, "Characterization of Al-doped Zn0 thermoelectric materials prepared by RF plasma powder processing and hot press sintering", Ceramics International, Elsevier, (2009), pp. 3067-3072.

* cited by examiner

US 8,333,912 B2

THERMOELECTRIC COMPOSITE MATERIAL AND METHOD OF PRODUCING THE SAME

CLAIM OF PRIORITY

This application claims the benefit of priority to patent application CN 200910054622.1, filed in China on Jul. 10, 2009, the contents of which are incorporated by reference herein.

FIELD OF THE DISCLOSURE

The present disclosure relates to a process for making a composite material, and composite materials with thermoelectric properties made by the process.

BACKGROUND

In recent decades, as the world's demand for exploiting new energy conversion materials increases, continuing interests have been focused on thermoelectric (TE) materials because of their clean and sustainable energy converting characteristics. The Seebeck effect is used to convert waste heat to electrical energy, while the Peltier effect is utilized in solid-state refrigeration devices. TE materials are widely used for generating electricity in waste energy recovery, navigation, spaceflight, armament, and household appliances. The efficiency of a material for TE applications is determined by the dimensionless figure of merit, defined as $ZT=(S^2 \sigma/\kappa)T$, where $S$, $\sigma$, $\kappa$ and $T$ are the Seebeck coefficient, electrical conductivity, thermal conductivity and absolute temperature, respectively. The higher the ZT value is, the higher the conversion efficiency of thermal energy to electricity.

TE material properties may be enhanced by eliminating impurities and adjusting the carrier concentrations. However, for the widely studied TE materials such as filled and/or doped-skutterudites, half-Heuslers, and clathrates, it is difficult to improve their ZT values further. Small radius atoms, i.e. alkali metals, alkaline-earth metals, and rare earth metals, could be introduced into the peculiar icosahedral cage of skutterudites to create a rattling effect. With the perturbation generated by the weak bonding between filled atoms and adjacent atoms, the phonons with low frequency are strongly scattered by the rattling effect. The phonons with low frequency are the main carriers for lattice thermal conductivity. As a result, the lattice thermal conductivity of filled-skutterudites is depressed in a large scale. Another approach is to substitute some sites in the TE materials with proper elements to provide a defect scattering effect, as well as to adjust the carrier concentrations.

The phonons which are used as heat carriers have a wide range frequency distribution. In the range of low frequency, point defects and rattling atoms are usually introduced for the scattering the phonons with relatively higher frequency. However, phonons with long wavelength are not affected efficiently. It is believed generally that the mean free path of electrons (holes) is much smaller than that of phonons. When the carrier energy is transferred as a wave, and the wave is collided by a particle with equivalent or smaller size than the wavelength, the scattering effect is strong. Based on this scattering effect, nanoparticles of a size smaller than the mean free path of phonons but larger than that of the electrons (holes) can be introduced into the matrix, to further decrease the lattice thermal conductivity, while keeping the electrical conductivity nearly unchanged.

In ideal thermoelectric composites the nanosized particles of the second phase are dispersed in the matrix homogeneously. If the nanosized particles are gathered together or agglomerated, a weakened scattering effect will result. In another words, the dispersion of the nanosized particles has an influence on depressing lattice thermal conductivity.

Several methods can be applied to introduce nanosized particles. Nano-powder can be mixed with a matrix powder via mechanical mixing, i.e. high energy ball milling. However, it can be difficult to de-agglomerate nano-powder by ball milling due to its high surface activity. As a result, the nanoparticles may not be dispersed homogeneously in the TE matrix. Additionally, impurities such as iron, alumina, and oxygen are very easily brought into the matrix by ball milling, which will deteriorate the electrical transport properties of the material.

A nanosized phase can be formed via an in-situ method originating from the matrix, for example, Sb from the filled-skutterudite, and Pb from PbTe. The notable advantage of in-situ generation is the homogeneous dispersion of the nanosized particles of the second phase. However, only a few metals can be used in this approach. For example, excess Co will lead to the formation of the second metallic phase $CoSb_2$ in skutterudite. The low melting point of Pb (~323° C.) and Sb (~631° C.) will also deteriorate the reliability of the composites. Further more, the size and morphology of the second phase can be difficult to control.

Nano-oxides can also be formed by oxidizing one component of the matrix. It can be difficult to control the oxidation of the matrix accurately via adjusting temperature, oxygen partial pressure, and other technique parameters. Selective oxidation is also not easy to achieve due to the reactivity of component elements.

SUMMARY

One embodiment of the invention includes a process for forming a composite material, which comprises:

providing a suspension composition comprising a solid thermoelectric material suspended within a liquid medium, wherein the thermoelectric material is selected from filled and/or doped skutterudites, Half-Heusler alloys, clathrates, and other thermoelectric ordered or non-ordered alloys, and thermoelectric intermetallics;

contacting the suspension composition with a solution of a metal oxide precursor dissolved in a solvent to form a reaction mixture;

hydrolyzing the metal oxide precursor in the presence of water to form a metal oxide; and separating a composite of the thermoelectric material and metal oxide from the liquid medium and solvent.

The composite material may, for example, have the formula of TE/z vol. % M, where TE denotes a thermoelectric material, M denotes an oxide or oxides which do not react with thermoelectric matrix, and $0.1 \leq z \leq 10$. The candidate oxides can be at least one of the oxides $TiO_2$, $ZnO$, $ZrO_2$, $WO_3$, $NiO$, $Al_2O_3$, $CeO_2$, $Yb_2O_3$, $Eu_2O_3$, $MgO$, and $Nb_2O_5$. The composite comprises the two phases (TE and M) and optionally additional phases. TE could represent, but is not limited to, filled and/or doped-skutterudite, half-Heuslers, and clathrates.

The composite material may be in the form of a nanocomposite, i.e., with M being in the form of nanoparticles. In one embodiment, the composite material comprises oxide nanoparticles homogeneously dispersed in the TE matrix. Nanoparticles, such as those with a size in the range of 1 nm to 100 nm, can be introduced into the TE matrix via the sol-gel process discussed above.

The composite powder resulting from the process may optionally be consolidated into dense bulk material by a pressed sintering technique, for example, spark plasma sintering, or hot-pressed sintering. The composite material exhibits an enhanced thermoelectric figure of merit due to improved Seebeck coefficient, depressed lattice thermal conductivity and nearly unchanged electrical conductivity. The process disclosed herein can provide the advantages of making nanocomposites with simple and easily controllable process, which is promising for mass production and manufacturing applications.

BRIEF DESCRIPTION OF THE DRAWINGS

The accompanying drawings are included to provide a further understanding of the invention, and are incorporated in and constitute a part of this specification. The drawings are not intended to be restrictive of the invention as claimed, but rather illustrate embodiments of the invention and, together with the description, serve to explain the principles of the invention.

DETAILED DESCRIPTION

Figure 1:
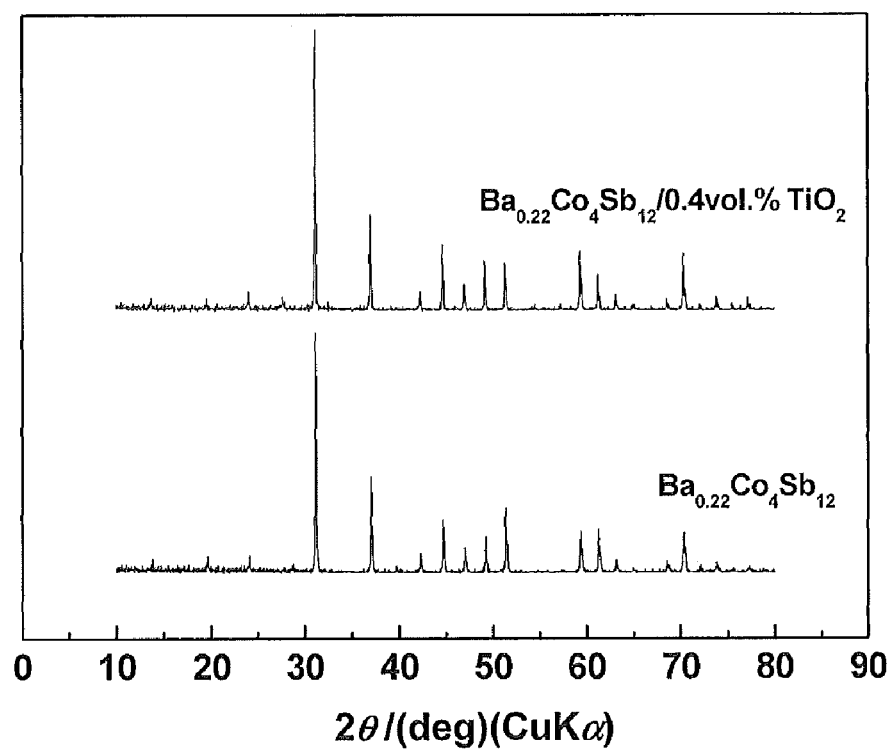
FIG. 1 is an XRD pattern of the $Ba_{0.22}Co_4Sb_{12}$/0.4 vol. % $TiO_2$ composite powder and $Ba_{0.22}CO_4Sb_{12}$ in Example 1.

It is to be understood that both the foregoing general description and the following detailed description are exemplary and explanatory only, and are not restrictive of the invention as claimed. Other embodiments of the invention will be apparent to those skilled in the art from consideration of the specification and practice of the invention disclosed herein. It is intended that the specification and examples be considered as exemplary only, with a true scope and spirit of the invention being indicated by the claims.

Embodiments of the invention provide nanocomposite thermoelectric materials and their method of making. The nanocomposite comprises a thermoelectric(TE) material powder as a matrix or a carrier, and nanoparticles as a second phase. The nanoparticles can be dispersed homogenously in the TE matrix.

Thus, one embodiment of the invention includes a process for forming a composite material, which comprises:

providing a suspension composition comprising a solid thermoelectric material suspended within a liquid medium, wherein the thermoelectric material is selected from filled and/or doped skutterudites, Half-Heusler alloys, clathrates, and other thermoelectric ordered or non-ordered alloys, and thermoelectric intermetallics;

contacting the suspension composition with a solution of a metal oxide precursor dissolved in a solvent to form a reaction mixture;

hydrolyzing the metal oxide precursor in the presence of water to form a metal oxide; and separating a composite of the thermoelectric material and metal oxide from the liquid medium and solvent.

The process may be used to make a composites, such as nanocomposites, of the formula TE/z vol % M, wherein TE is a thermoelectric material that can be, for example, a filled and/or doped skutterudite, Half-Heusler, or clathrate, z is a number in the range of $0.1 \leq z \leq 10$, and M is, for example, an oxide or oxides which do not react with thermoelectric matrix. The candidate oxides can be chosen at least from the group of $TiO_2$, $ZnO$, $ZrO_2$, $WO_3$, $NiO$, $Al_2O_3$, $CeO_2$, $Yb_2O_3$, $Eu_2O_3$, $MgO$, and $Nb_2O_5$. A nanosized second phase of oxide particles can be dispersed homogenously in the TE matrix, contributing to a scattering effect. The second phase nanoparticles can be controllable in terms of amount, size, and shape. For instance, the particle size of second phase metal oxide can be controlled in the range of 1-500 nm, or 1-100 nm, such as in the range of 1-40 nm.

The present invention overcomes one or more disadvantages of available composite fabrication techniques and proposes a novel route for fabricating thermoelectric composites through a sol-gel method. For instance, the process can avoid introducing impurities into the thermoelectric matrix except nanoinclusions. The colloids can decompose into pure nanosized oxides by a proper heat treatment. In contrast, in a conventional mechanical mixing method, some impurities such as iron, alumina, and oxygen are very easily brought into the matrix.

In addition, the figure-of-merit (ZT) value of the nanocomposite with the use of nanosized second phase can be increased at least 10%. The composite materials made through the invention can also possess lower lattice thermal conductivity, higher Seebeck coefficient, and unchanged electrical conductivity.

One step in the process of the invention comprises providing a suspension composition comprising a solid thermoelectric material suspended within a liquid medium, wherein the thermoelectric material is selected from filled and/or doped skutterudites, Half-Heusler alloys, clathrates, and other thermoelectric ordered or non-ordered alloys, and thermoelectric intermetallics. In some embodiments, the thermoelectric material is provided as a powder that is a filled and/or doped-skutterudite, half-Heusler alloy, or clathrate. The TE materials can be dispersed into the liquid, for example, to form a suspension by ultrasonic dispersion. The ultrasonic dispersion time may range, for example, from 0.1 to 5 hrs.

The liquid medium could be an organic or an inorganic medium. The inorganic media can comprise deionized water, for instance. The organic medium can comprise, for example, an alcohol, ketone, or hydrocarbon, such as ethanol, acetone, or n-hexane. The volume concentration of liquid medium may range, for example, from 5 to 90%.

Another step in the process of the invention comprises contacting the suspension composition with a solution of a metal oxide precursor dissolved in a solvent to form a reaction mixture. Example metal oxide precursors includes metal precursor salts, such as the ammonium salt, chlorine salt, acetic acid salt, oxalate salt, or alcohol salt of the metal such as titanium, zinc, zirconium, tungsten, nickel, aluminum, cerium, ytterbium, europium, magnesium, and niobium. The metal oxide precursor may be dissolved into any appropriate solvent that forms a solution of the metal oxide precursor. Exemplary solvents include, for example, deionized water, anhydrous ethanol, n-butyl alcohol, and ammonia.

An additional step in the process of the invention comprises hydrolyzing the metal oxide precursor in the presence of water to form a metal oxide. Water may be present in the liquid medium or solvent, or may be added separately to the reaction mixture. The solution of the metal oxide precursor can be dropped slowly into the stirred suspension of TE material until the hydrated metal oxide coats the thermoelectric matrix. The suspension may be stirred during the hydrolyzation continuously. The stiffing rate may range from 10 to 180 r/min. The dripping speed of the solution containing precursor could be adjusted to control the hydrolyzation, which can be in the range of 0.01~10 mL/min. The pH value of the suspension could be adjusted via adding acid or ammonia to control the hydrolyzation speed of precursor salts of metal oxides. The forming of the colloidal suspensions can be assisted by heating and stirring. Heating temperature can be 60~100° C., and stirring time can be in the range of 20~100 min.

A further step in the process of the invention comprises separating a composite of the thermoelectric material and metal oxide from the liquid medium and solvent. The separation method can be one of the methods such as filtering, centrifuge, and evaporation. The composite may then be dried at a temperature ranging from 50 to 150° C., for example.

The separated material may then be calcinated at a temperature of, for example, 200-600° C. for 0.5~24 hrs. A dense bulk TE material can be synthesized by press sintering technology such as SPS(spark plasma sintering) and HP(hot pressing). The sintering temperature is in the range of 450~800° C., time is 2~60 min, and pressure is 10~100 MPa.

According to above, the volume concentration of the metal oxide second phase is in the range of 0.1-10%. The second phase should be selected to be chemically stable with the TE matrix. The particle size of the second phase may be in the range of 1~100 nm. The nanoparticles of the second phase can be dispersed at the grain boundaries of the TE matrix or within the matrix grains.

The TE materials described above, as compared to ones without the second phase, can have the characteristics of (a) lower lattice thermal conductivity, (b) higher Seebeck coefficient, and (c) basically remain unchanged electrical conductivity. Therefore, the composite TE materials properties can be improved dramatically over conventional materials.

Unless otherwise indicated, all numbers used in the specification and claims are to be understood as being modified in all instances by the term "about," whether or not so stated. It should also be understood that the precise numerical values used in the specification and claims form additional embodiments of the invention. Efforts have been made to ensure the accuracy of the numerical values disclosed in the Examples. Any measured numerical value, however, can inherently contain certain errors resulting from the standard deviation found in its respective measuring technique.

As used herein the use of "the," "a," or "an" means "at least one," and should not be limited to "only one" unless explicitly indicated to the contrary.

Other embodiments of the invention will be apparent to those skilled in the art from consideration of the specification and practice of the invention disclosed herein. It is intended that the specification and examples be considered as exemplary only, with a true scope and spirit of the invention being indicated by the claims.

Examples

The following examples are not intended to be limiting of the invention as claimed.

Example-I: 2.0 g fine powders of $Ba_{0.22}Co_4Sb_{12}$ (actual composition) were dispersed in 25 ml alcohol (85 vol. %) under ultrasonic for 30 min. Subsequently, for the final $Ba_{0.22}Co_4Sb_{12}/0.4$ vol. % $TiO_2$ composition, 1.9 ml tetrabutyl titanate ($Ti(OC_4H_9)_4$) solution diluted by alcohol (1 vol. % of the $Ti(OC_4H_9)_4$ solution) was dropped slowly into the $Ba_{0.22}Co_4Sb_{12}$ suspension being stirred. After hydrolyzing completely, the suspension was filtrated by a vacuum filter. The resulting powder was dried at 120° C. in vacuum for 2 h, and then loaded into a quartz crucible for heat treatment at 470° C. for 2 h with an atmosphere of Ar-7 vol. % $H_2$. The composite powder was consolidated by spark plasma sintering (SPS) at 590° C. for 10 min under a pressure of 60 MPa to obtain a dense pellet.

Figure 2:
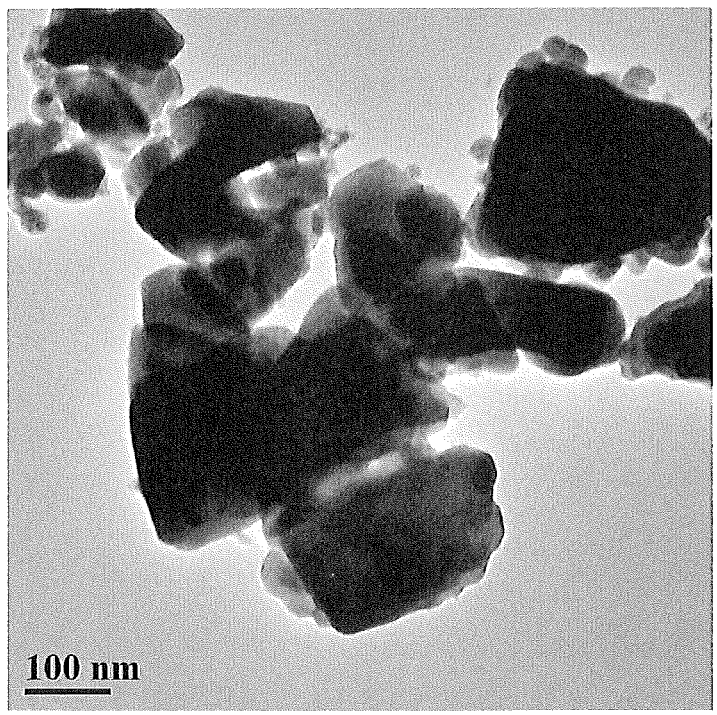
FIG. 2 is a TEM image for the $Ba_{0.22}Co_4Sb_{12}$/0.4 vol. % $TiO_2$ composite powder in Example 1.
Figure 3:
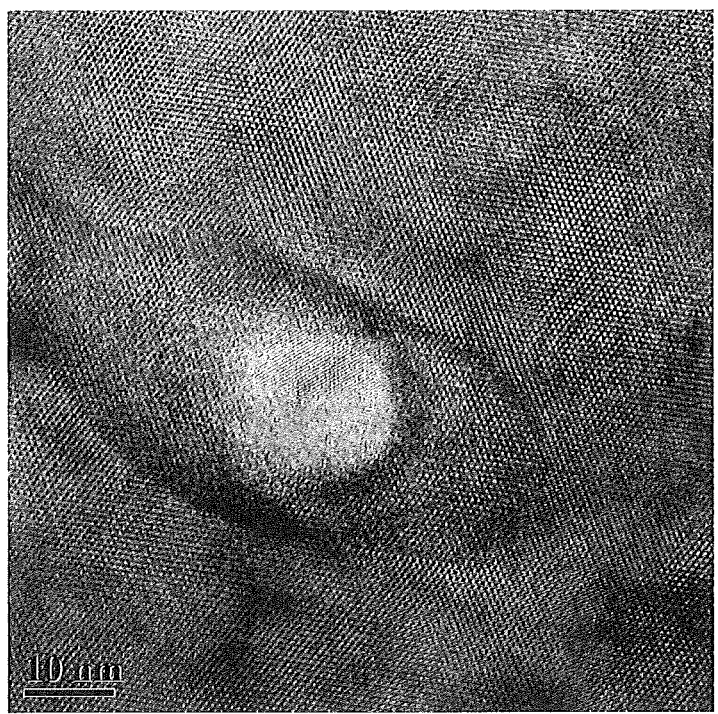
FIG. 3 is a TEM image for the sample of $Ba_{0.22}Co_4Sb_{12}$/0.4 vol. % $TiO_2$ composite in Example 1.

The results of phase analysis, structure, and thermoelectric properties of the resulting material are shown in FIG. 1 to 7. FIG. 1 is an XRD pattern of the $Ba_{0.22}Co_4Sb_{12}/0.4$ vol. % $TiO_2$ composite powder. No phase change or new phase is present for the filled-skutterudite matrix after composited with $TiO_2$. FIG. 2 is a TEM image for the $Ba_{0.22}Co_4Sb_{12}/0.4$ vol. % $TiO_2$ composite powder. Nanosized $TiO_2$ particles disperse in the $Ba_{0.22}Co_4Sb_{12}$ submicrosized matrix homogeneously. FIG. 3 is a TEM image for the sample of $Ba_{0.22}Co_4Sb_{12}/0.4$ vol. % $TiO_2$ composite. $TiO_2$ particles with a size of 10-15 nm were dispersed in the matrix.

Figure 4:
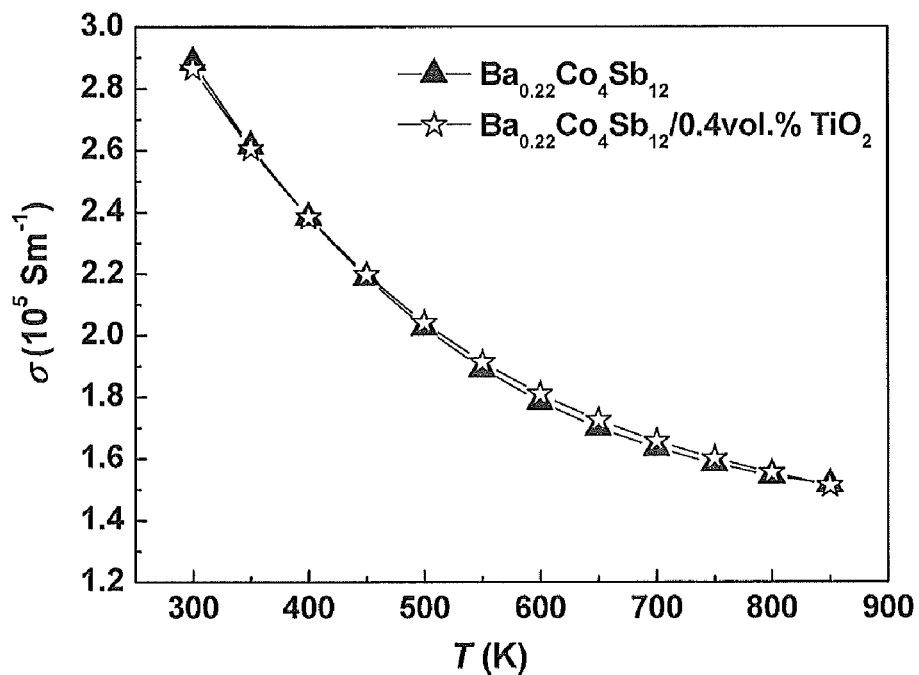
FIG. 4 is a plot of electrical conductivity vs. temperature for the samples in Example 1, $Ba_{0.22}CO_4Sb_{12}$/0.4 vol. % $TiO_2$ composite and $Ba_{0.22}Co_4Sb_{12}$.
Figure 5:
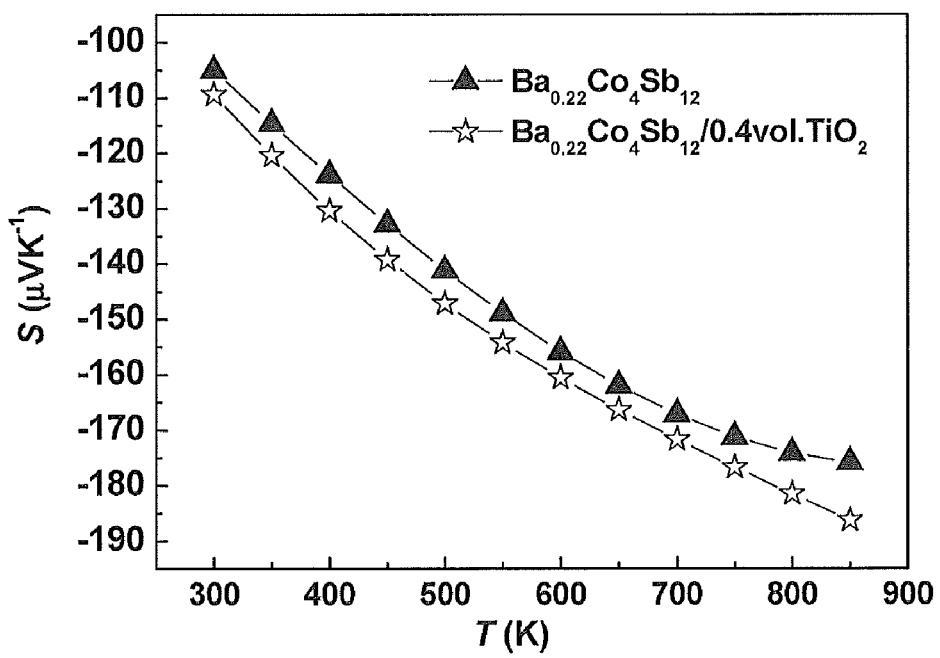
FIG. 5 is a plot of Seebeck coefficient (S) vs. temperature for the samples in Example 1, $Ba_{0.22}CO_4Sb_{12}$/0.4 vol. % $TiO_2$ composite and $Ba_{0.22}Co_4Sb_{12}$.
Figure 6:
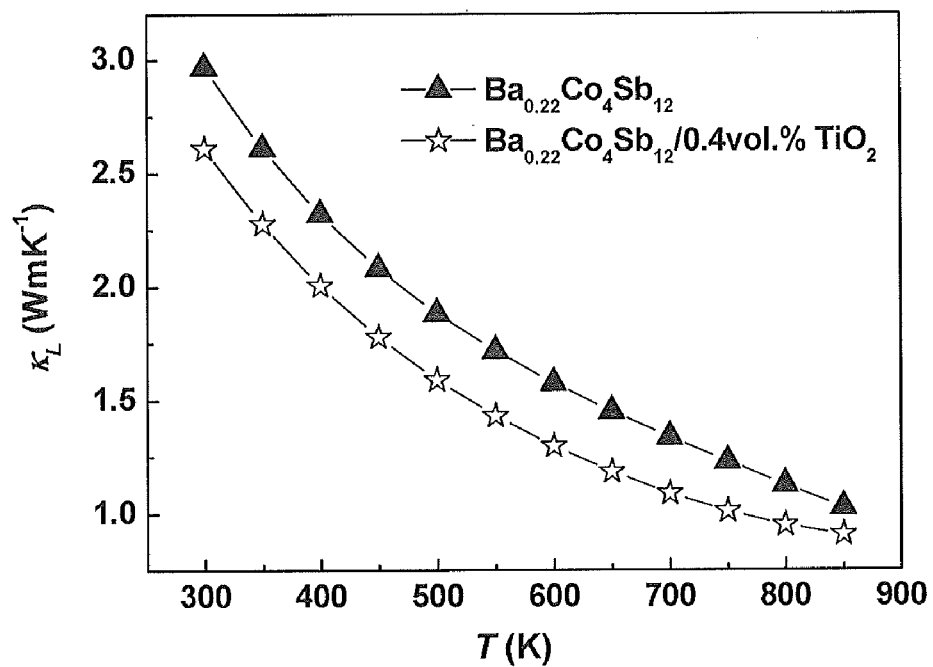
FIG. 6 is a plot of lattice thermal conductivity vs. temperature for the samples in Example 1, $Ba_{0.22}Co_4Sb_{12}$/0.4 vol. % $TiO_2$ composite and $Ba_{0.22}Co_4Sb_{12}$.
Figure 7:
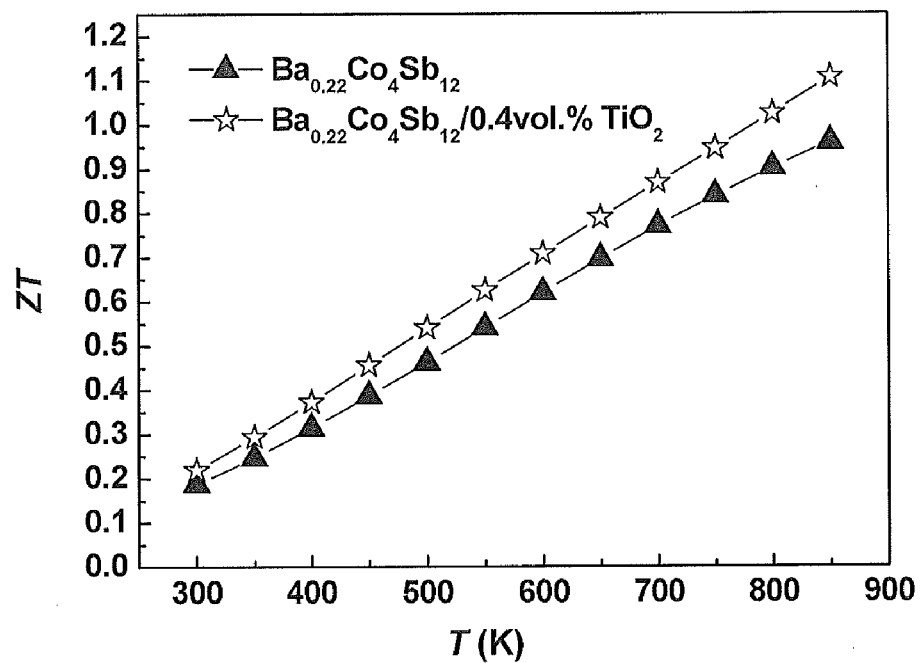
FIG. 7 is a plot of the Figure of merit (ZT) vs. temperature for the samples in Example 1, $Ba_{0.22}Co_4Sb_{12}$/0.4 vol. % $TiO_2$ composite and $Ba_{0.22}Co_4Sb_{12}$.

FIG. 4 is a plot of electrical conductivity vs. temperature for the samples in this example, $Ba_{0.22}Co_4Sb_{12}/0.4$ vol. % $TiO_2$ composite and $Ba_{0.22}Co_4Sb_{12}$. The electrical conductivity was unchanged after introducing nano-$TiO_2$. FIG. 5 is a plot of Seebeck coefficient (S) vs temperature for the samples in this example, $Ba_{0.22}Co_4Sb_{12}/0.4$ vol. % $TiO_2$ composite and $Ba_{0.22}Co_4Sb_{12}$. The barrier in the grain boundary will provide an extra grain potential, which will increase the Seebeck coefficients. FIG. 6 is a plot of lattice thermal conductivity vs. temperature for the samples in this example, $Ba_{0.22}Co_4Sb_{12}/0.4$ vol. % $TiO_2$ composite and $Ba_{0.22}Co_4Sb_{12}$. The nanoinclusions will scatter the low wavelength phonons effectively, resulting in a depression of lattice thermal conductivity. FIG. 7 is a plot of the Figure of merit (ZT) vs. temperature for the samples in this example, $Ba_{0.22}Co_4Sb_{12}/0.4$ vol. % $TiO_2$ composite and $Ba_{0.22}Co_4Sb_{12}$. The ZT value can be improved by introducing nanoinclusions.

Example-II: 2.0 g fine powders of $Ba_{0.22}Co_4Sb_{12}$ (actual composition) were dispersed in 30 ml alcohol (95 vol. %) under ultrasonic conditions for 50 min. Subsequently, for the final $Ba_{0.22}Co_4Sb_{12}/0.8$ vol. % $TiO_2$ composition, 2.5 ml tetrabutyl titanate ($Ti(OC_4H_9)_4$) solution diluted by alcohol (1.5 vol. % of the $Ti(OC_4H_9)_4$ solution) was dropped slowly into the $Ba_{0.22}Co_4Sb_{12}$ suspension being stirred. After hydrolyzing completely, the suspension was filtrated by a vacuum filter. The resulting powder was dried at 110° C. in vacuum for 4 h, and then loaded into a quartz crucible for heat treatment at 490° C. for 1.5 h with an atmosphere of Ar. The composite powder was consolidated by spark plasma sintering (SPS) at 605° C. for 8 min under a pressure of 50 MPa to obtain a dense pellet. A ZT value 1.02 at 850 K was achieved for the sample of $Ba_{0.22}Co_4Sb_{12}/0.8$ vol. % $TiO_2$.

Example-III: 2.0 g fine powders of $Ba_{0.22}Co_4Sb_{12}$ (actual composition) were dispersed in 35 ml deionized water under ultrasonic for 20 min. Subsequently, for the final $Ba_{0.22}Co_4Sb_{12}/1.8$ vol. % $TiO_2$ composition, 4.3 ml tetrabutyl titanate $(Ti(OC_4H_9)_4)$ solution diluted by alcohol (2 vol. % of the $Ti(OC_4H_9)_4$ solution) was dropped slowly into the $Ba_{0.22}Co_4Sb_{12}$ suspension being stirred. After hydrolyzing completely, the suspension was filtrated by a vacuum filter. The resulting powder was dried at 130 degrees in vacuum for 1 h, and then loaded into a quartz crucible for heat treatment at 450° C. for 6 h with an atmosphere of $N_2$. The composite powder was consolidated by hot pressing (SPS) at 585° C. for 40 min under a pressure of 80 MPa to obtain a dense pellet. The Seebeck coefficient was increased to $-119$ $\mu VK^{-1}$ at 300 K, and a considerable increase of 13% was obtained.

Figure 8:
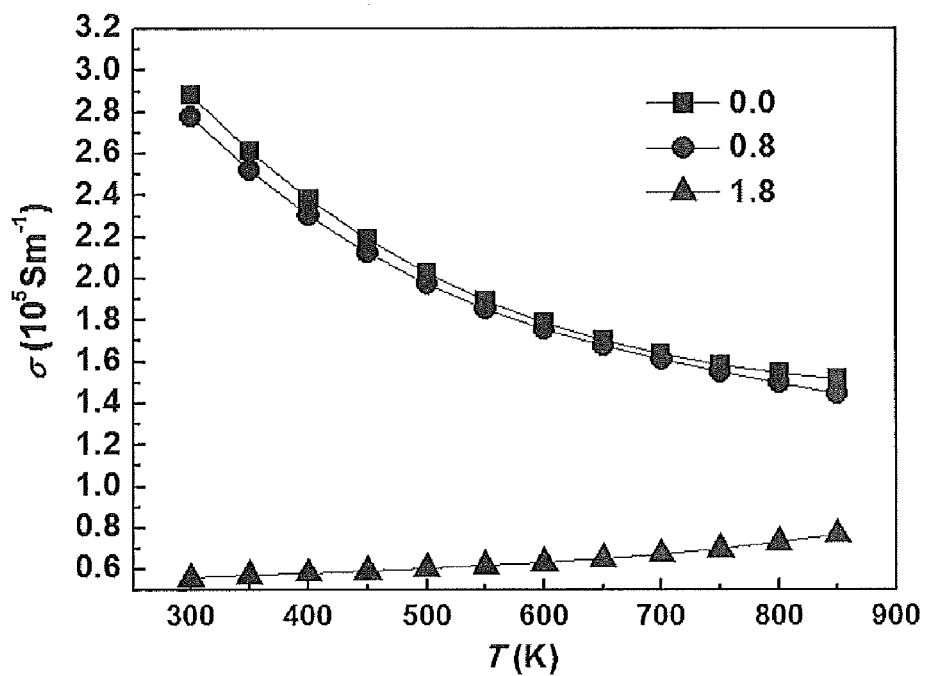
FIG. 8 is a plot of the electrical conductivity vs. temperature for the samples in Examples 2 and 3, $Ba_{0.22}Co_4Sb_{12}$/xvol. % $TiO_2$ (x=0.0, 0.8, 1.8) composites.
Figure 9:
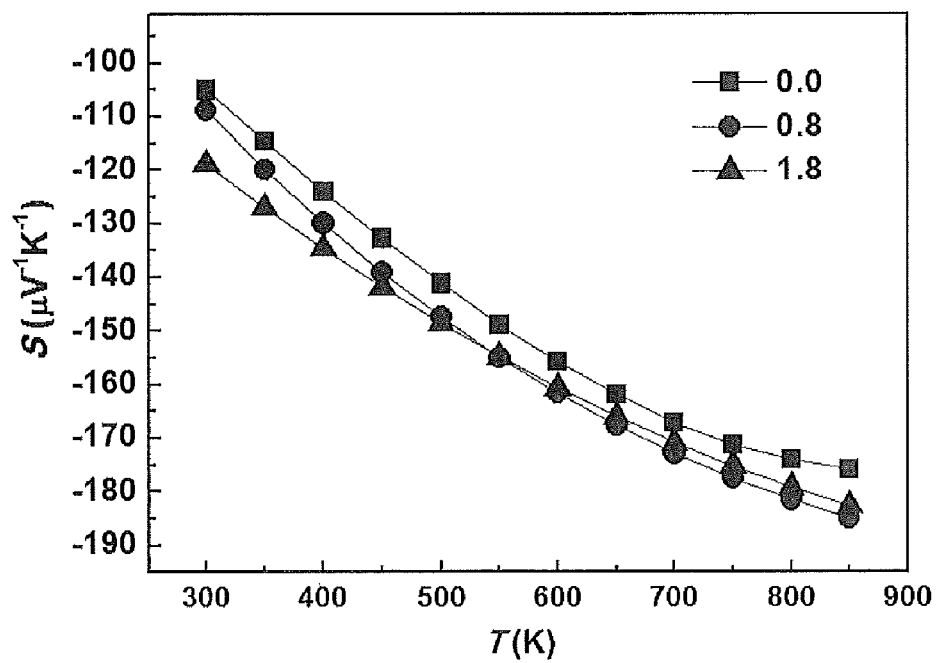
FIG. 9 is a plot of the Seebeck coefficient (S) vs. temperature for the samples in Examples 2 and 3, $Ba_{0.22}Co_4Sb_{12}$/xvol. % $TiO_2$ (x=0.0, 0.8, 1.8) composites.
Figure 10:
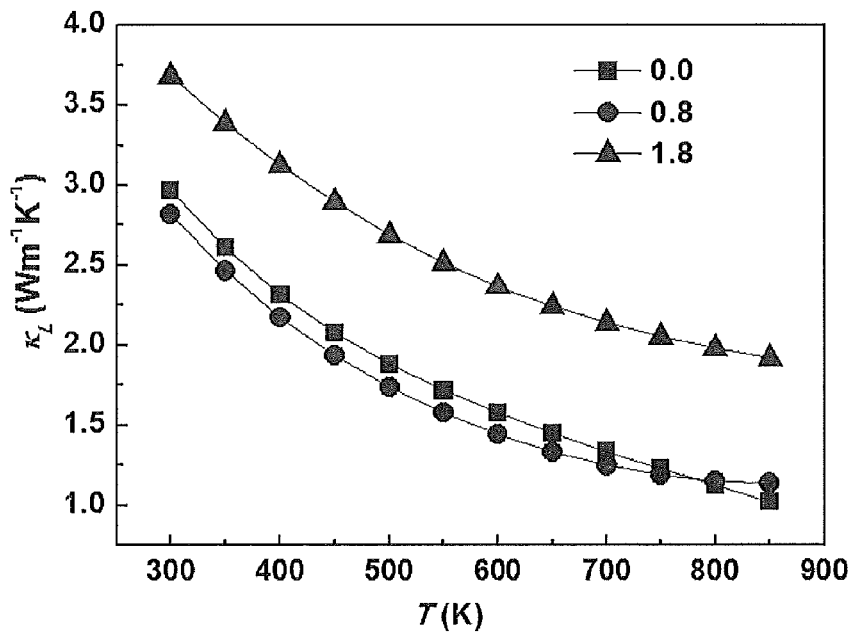
FIG. 10 is a plot of the Lattice thermal conductivity vs. temperature for the samples in Examples 2 and 3, $Ba_{0.22}Co_4Sb_{12}$/xvol. % $TiO_2$ (x=0.0, 0.8, 1.8) composites.
Figure 11:
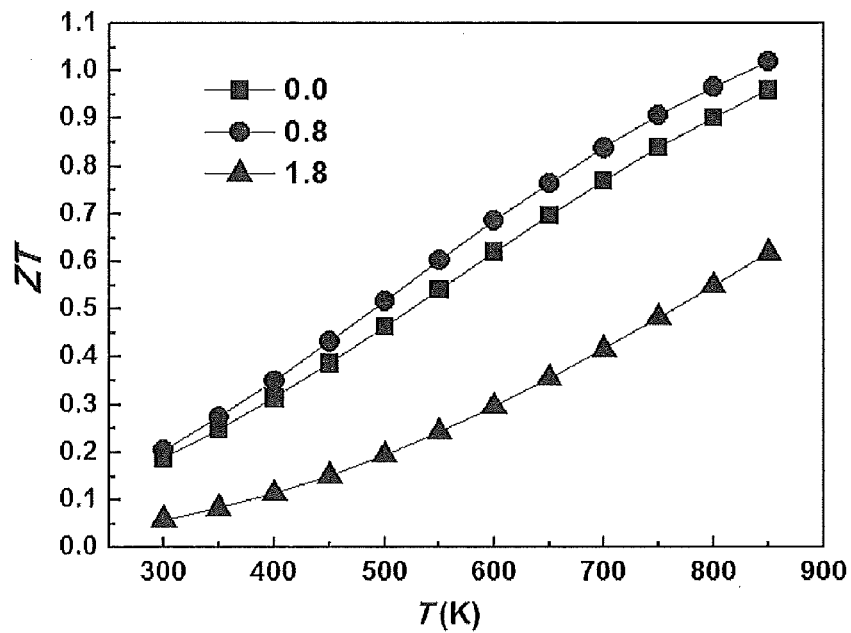
FIG. 11 is a plot of the Figure of merit (ZT) vs. temperature for the samples in Examples 2 and 3, $Ba_{0.22}Co_4Sb_{12}$/xvol. % $TiO_2$ (x=0.0, 0.8, 1.8) composites.

FIG. 8 is a plot of the electrical conductivity vs temperature for the samples in Examples 2 and 3, $Ba_{0.22}Co_4Sb_{12}/x$vol. % $TiO_2$ (x=0.0, 0.8, 1.8) composites. FIG. 9 is a plot of the Seebeck coefficient (S) vs temperature for the samples in Examples 2 and 3. FIG. 10 is a plot of the Lattice thermal conductivity vs temperature for the samples in Examples 2 and 3. FIG. 11 is a plot of the Figure of merit (ZT) vs temperature for the samples in Examples 2 and 3.

Example-IV: 2.5 g fine powders of $Ba_8Ga_{16}Ge_{30}$ (nominal composition) were dispersed in 30 mL alcohol (95 vol. %) under ultrasonic for 40 min. Subsequently, for the final $Ba_8Ga_{16}Ge_{30}/1.4$ vol. % $ZrO_2$ composition, a certain volume of zirconyl(di)chloride $(ZrOCl_2.8H_2O)$ solution diluted by alcohol (3 vol. % of the $ZrOCl_2$ solution) was dropped slowly into the $Ba_8Ga_{16}Ge_{30}$ suspension being stirred, and ammonium hydroxide$(NH_3.H_2O)$ was dropped in simultaneously. After hydrolyzing completely, the suspension was filtrated by a vacuum filter. The resulting powder was dried at 150° C. in vacuum for 1.5 h, and then loaded into a quartz crucible for heat treatment at 450° C. for 3 h with an atmosphere of Ar. The composite powder was consolidated by spark plasma sintering (SPS) at 550° C. for 15 min under a pressure of 50 MPa to get a dense pellet. The Seebeck coefficient was increased from $-186.1$ $\mu V/K$ to $-195$ $\mu V/K$ at 850 K, resulting in a ZT increase of 15% (ZT=0.75) at 850 K.

Example-V: 2.0 g fine powders of $Ti_{0.7}Zr_{0.3}CoSb$ (nominal composition) were dispersed in 25 mL alcohol (90 vol. %) under ultrasonic for 30 min. Subsequently, for the final $Ti_{0.3}Zr_{0.3}CoSb/2.0$ vol. % $TiO_2$ composition, a certain volume of tetrabutyl titanate $(Ti(OC_4H_9)_4)$ solution diluted by alcohol (3 vol. % of the $Ti(OC_4H_9)_4$ solution) was dropped slowly into the $Ti_{0.3}Zr_{0.3}CoSb$ suspension being stirred. After hydrolyzing completely, the suspension was filtrated. The resulting powder was dried at 150° C. in vacuum for 3 h, and then loaded into a quartz crucible for heat treatment at 500° C. for 1 h with an atmosphere of Ar. The composite powder was consolidated by spark plasma sintering (SPS) at 650° C. for 10 min under a pressure of 50 MPa to get a dense pellet. The lattice thermal conductivity is depressed from 5.67 $Wm^{-1}K^{-1}$ to 4.73 $Wm^{-1}K^{-1}$ at room temperature (300K), and the ZT value of 0.45 was obtained at 850 K, with an increase of 18%.

We claim:

1. A process for forming a composite material, which comprises:
   providing a suspension composition comprising a solid thermoelectric material suspended within a liquid medium, wherein the thermoelectric material is selected from filled and/or doped skutterudites, Half-Heusler alloys, clathrates, and other thermoelectric ordered or non-ordered alloys, and thermoelectric intermetallics;
   contacting the suspension composition with a solution of a metal oxide precursor dissolved in a solvent to form a reaction mixture;
   hydrolyzing the metal oxide precursor in the presence of water to form a metal oxide; and
   separating a composite of the thermoelectric material and metal oxide from the liquid medium and solvent.

2. A process of claim 1, wherein the thermoelectric material comprises a filled and/or doped skutterudite.

3. A process of claim 1, wherein the thermoelectric material comprises a Half-Heusler alloy.

4. A process of claim 1, wherein the thermoelectric material comprises a clathrate.

5. A process of claim 1, wherein the liquid medium comprises water.

6. A process of claim 1, wherein the liquid medium comprises an alcohol, a ketone, or a hydrocarbon.

7. A process of claim 1, wherein the metal oxide precursor comprises a precursor salt of the metal oxide.

8. A process of claim 7, wherein the precursor salt comprises an ammonium salt, chloride, acetate, oxalate or alcoholate of the metal oxide.

9. A process of claim 1, wherein the metal oxide precursor comprises a precursor of an oxide of titanium, zinc, zirconium, tungsten, nickel, aluminum, cerium, ytterbium, europium, magnesium, or niobium.

10. A process of claim 1, wherein the solvent comprises water, an alcohol, or ammonia.

11. A process of claim 1, wherein the liquid medium and/or the solvent comprise water.

12. A process of claim 1, which comprises adding water to the reaction mixture.

13. A process of claim 1, which comprises hydrolyzing the metal oxide precursor at a temperature of from 60° C. to 100° C.

14. A process of claim 1, which comprises separating the composite of the thermoelectric material and metal oxide from the liquid medium and solvent by filtration and/or drying.

15. A process of claim 1, which further comprises heating the separated composite.

16. A process of claim 15, which comprises heating the separated composite at a temperature of from 200° C. to 600° C. for a period of from 0.5 to 24 hours.

17. A process of claim 1, which further comprises sintering the separated composite.

18. A process of claim 17, which comprises sintering the separated composite by spark plasma sintering or hot pressing.

* * * * *